United States Patent [19]

Gordon

[11] Patent Number: 4,768,017

[45] Date of Patent: Aug. 30, 1988

[54] CIRCUIT FOR PROVIDING HIGH SAMPLING RATE RESOLUTION USING SLOW SAMPLING RATE

[75] Inventor: James H. Gordon, Fairfax, Va.

[73] Assignee: Sonotek, Inc., Springfield, Va.

[21] Appl. No.: 76,267

[22] Filed: Jul. 22, 1987

[51] Int. Cl.$^4$ .............................................. H03M 1/12
[52] U.S. Cl. ...................... 340/347 SH; 340/347 AD
[58] Field of Search ................. 340/347 AD, 347 CC, 340/347 SH

[56] References Cited

U.S. PATENT DOCUMENTS 4,345,241  8/1982  Takeuchi et al. ......... 340/347 SH X
4,611,194  9/1986  Konig et al. ................. 340/347 SH Primary Examiner—William M. Shoop, Jr.
Assistant Examiner—Richard K. Blum
Attorney, Agent, or Firm—Jay M. Cantor

[57] ABSTRACT

The disclosure relates to a circuit using a relatively inexpensive low sampling rate resolution A/D converter for sampling repetitive signals which provides resolution far superior to that obtained normally from the converter being used. This is accomplished by providing a programmable variable delay which delays the system clock signal with respect to the trigger signal and controls the A/D converter with the delayed clock signal. The A/D converter receives input signal initiated by a flip flop responsive to a system start signal and the clock signal. The delay is varied for successive sampling of the repetitive signal received from the system under test so that sampling takes place at numerous points along the test signal. The converted signals are stored under joint control of the delayed clock signals and the output of the initiating signal from the flip flop. A gated clock circuit is used where an externally generated trigger is being used.

21 Claims, 3 Drawing Sheets

CIRCUIT FOR PROVIDING HIGH SAMPLING RATE RESOLUTION USING SLOW SAMPLING RATE

BACKGROUND OF THE INVENTION

1. Field of the Invention

This invention relates to a circuit for sampling repeatable information signals where the sampling point on the signal is controllably varied by means of a controlled variable delay line to provide sampling at different points along the signal wave after plural successive samplings thereof.

2. Brief Description of the Prior Art

It is often necessary to sample signals at a sampling rate higher than the capability of the available equipment. Such problems often occur due to limitations in the art or for reasons of economics where the equipment having the desired capability is not an economically viable alternative. In the prior art, it has normally been necessary to either utilize the economically unfeasible equipment or, alternatively, to use reduced capability equipment with the inherent inferior results. In either case, there is a tradeoff required in order to provide the high sampling rate required. In one case there is an economic penalty and in the other case there is a resolution penalty. For this reason, where cost is a significant factor, it often becomes economically unfeasible to provide the required sampling rates in converting an analog to a digital signal.

One attempt to overcome this problem is provided in U.S. Pat. No. 4,595,908 of James H. Gordon. In this circuit, a relatively inexpensive, relatively slow sampling rate A-D converter is used to provide results which approach those of higher sampling rate converters. A trigger signal is generated, which signal is provided as an output to trigger the occurrence of an event. The event has associated therewith an analog signal which is synchronous with the trigger signal. Also synchronous with the trigger and analog signals is the digitization of the analog signal by the analog to digital converter. There is a memory buffer that is filled with the digitized waveform at a fixed sampling rate. Both the analog to digital converter and the address counter for the memory buffer are clocked by a fixed frequency, continuously running clock. For example, at a sampling rate of 25 MHz. the analog signal is sampled every 40 ns, converted to a digital value and stored in the memory buffer. If the memory buffer is 1024 bytes in length, the circuit continues to digitize and store the values until the memory buffer is full.

The delay circuit is inserted in series with the trigger out signal. The trigger out signal will be delayed with respect to the digitization and storing process. For example, the delay circuit is digitally controlled and can be made to delay the trigger signal in 5 ns increments from 0 ns to 35 ns in eight steps. If the analog signal is synchronous and repeatable with respect to the trigger out signal, then the analog signal may be equivalently sampled at 200 MHz using the delay line in this example. Eight triggers must be issued, each with a different delay inserted. If the memory buffer is 1024 bytes in length, for example, then eight buffers are accumulated containing the same waveform. The digitized points on the waveforms are offset in time by 5 ns. When the eight buffers are interleaved and combined to form one buffer that is 8192 bytes in length, this new buffer now represents the digitized waveform equivalently sampled every 5 ns or at a sampling rate of 200 MHz.

The deficiency of this method is that the circuit must be in control of the analog signal. That is, it must provide a trigger out signal that will cause a synchronous, repeatable analog signal to be generated by a slaved external event. This method cannot digitize free running repetitive signals, even if there is a synchronous trigger signal provided with the analog signal. The problem is that the analog signal, though repeatable, is occurring asynchronously with respect to the free running clock used by the analog to digital converter.

SUMMARY OF THE INVENTION

In accordance with the present invention, there is also provided a system in which the resolution of the prior art high resolution A/D converters is provided while using a relatively inexpensive low resolution A/D converter which also minimizes the above noted problems of the prior art.

Briefly, this is accomplished by providing a delay circuit which is placed directly after the master clock for the analog to digital converter circuit. The master clock, instead of being free running, is a synchronously gatable clock capable of stopping and restarting in response to an externally generated trigger signal. Once restarted, the clock will free run at the desired sampling rate (i.e., for example, 25 MHz) but will be synchronous to the external trigger signal.

This circuit is capable of equivalently sampling repetitive signals that are controlled by the circuit and by free running repetitive signals that have a synchronous trigger associated therewith. The synchronous trigger can be supplied externally or can be generated by the circuit using an analog comparator to compare the signal to a reference level. When the signal crosses the threshold set by the reference, the comparator provides a trigger signal that is synchronous with the analog signal.

The trigger signal will always be generated at the same time and will not be delayed when responding to a command to output a trigger signal. The clock which is used to initiate a sample by the analog to digital converter, write the digitized data into memory and clock the address counters for memory, is being delayed with respect to the trigger out signal. This achieves the same result as the above noted patent, however now the clock is delayed with respect to the trigger. The above noted patent, on the other hand, delays the trigger with respect to the clock.

Placing the delay circuit after a gated clock allows higher equivalent sampling rates for repetitive signals that are asynchronous to the clock, but have a synchronous trigger associated with the signal to be sampled. The trigger is used to synchronize the gated clock to the analog signal. The clock can always operate in the gated mode, if desired. The circuit will operate in the same manner in response to an internal or external trigger. As previously described, the analog signal itself can be compared to a fixed reference to generate a trigger that will always coincide with the same point on the analog signal and thus be a synchronous trigger. Triggering directly off the analog signal removes the need to have a synchronous trigger provided externally with the analog signal.

As in above noted U.S. Pat. No. 4,595,908, the equivalent sampling rate is limited only by the resolution of the incremental delay of the delay circuit. For example, to equivalently sample a repetitive analog signal at 2000 MHz, a delay circuit with 0.5 ns increments from 0 to 39.5 ns in eighty steps would be required. Eighty repetitive analog signals would be digitized and stored in eighty memory buffers with a time offset between successive buffers being 0.5 ns. When the eighty buffers are interleaved and combined to form one buffer, the new buffer represents the digitized waveform equivalently sampled every 0.5 ns or at a sampling rate of 2000 MHz.

The circuit of the present invention could be improved by automatically interleaving the digitized data to the correct memory location, thereby removing this burden from the software and speeding up operation. Furthermore, a sample and hold circuit can be used to increase the analog bandwidth and reduce digitization errors that are associated with analog to digital converters when the analog signal is slewing faster than the acquisition window of the converter.

Briefly the circuit of the present invention includes an optionally gate controlled clock circuit which drives a flip flop in conjunction with a system start trigger signal, the clock also providing the input to a programmable variable delay line. The output of the flip flop provides a trigger pulse to initiate an event which has a repetitive analog signal associated with the trigger that is digitized by the A/D converter. The converter is clocked by the output of the delay line and therefore samples the signal at points thereon determined by the amount of delay programmed into the delay line. The memory commences counting address locations with receipt of the trigger pulse, counting taking place in response to an output signal from the delay line. Therefore, if the amount of delay in the delay line is varied for each sampling, in the event eight samplings are to take place, for example, three input lines are required to the delay line to program the possible eight different delay possibilities. In this way, with a repetitive signal being sampled, after eight scans of the information signal have been provided, a high resolution signal will be obtained from the memory via the A/D converter.

DESCRIPTION OF THE PREFERRED EMBODIMENT

Figure 1:
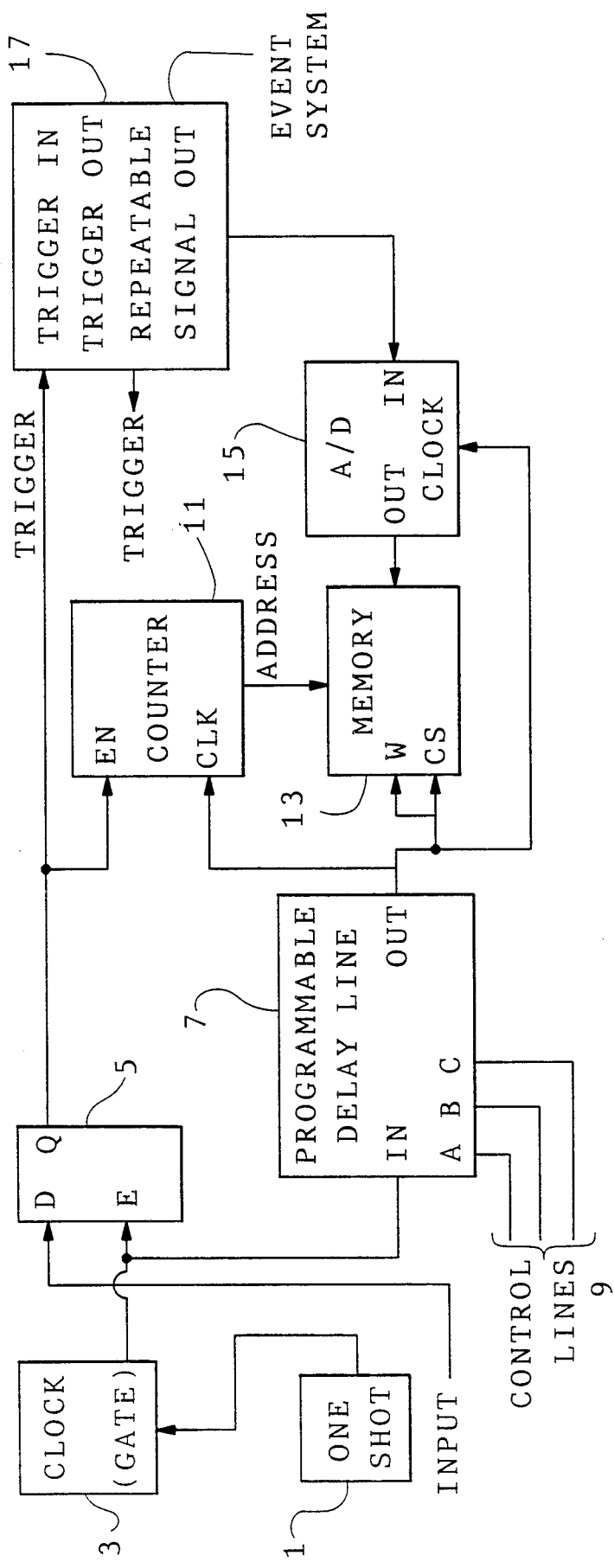
FIG. 1 is a block diagram of a circuit in accordance with the present invention.

Referring now to FIG. 1, there is shown a block diagram of a preferred embodiment of a circuit in accordance with the present invention.

The circuit includes an input which can be a trigger start signal generated by internal software or the like or a trigger start signal generated from an external source. Accordingly, in the event there is no need for external synchronization, the master oscillator 3 can be free running whereas, in the event synchronization of some type must be provided initially, the oscillator 3 will be a gated oscillator with operation thereof being controlled by a one shot 1. The embodiment using the one shot will be described herein, it being understood that the free-running oscillator can be substituted for the one shot 1 and gated oscillator where the requirements so permit. Also, the clock frequency of the oscillator 3 will be arbitrarily selected to be 25 MHz.

The input trigger signal is applied to the one shot 1 and to the D input of the flip flop 5. Flip flop 5 is designed to provide an output at terminal Q thereof when the D input thereof has been set and the leading edge of a pulse is applied to the enable input E thereof. Accordingly, the one shot will apply a gating signal to the gated oscillator or clock 5 at some predetermined time after the input trigger has been applied thereto. This gating signal will reset the clock, causing it to cease oscillation and then to commence oscillating at its designed oscillation rate after a predetermined delay to provide an output pulse on the E input of flip flop 5 as well as to provide the same input pulse to programmable delay line 7. The flip flop 5 will provide an output trigger signal at output Q upon receiving the leading rising edge of the clock at the enable input E thereof.

The delay line 7 will be set to permit the input pulse thereto from clock 3 to travel through the delay line with a programmed or controlled delay as determined by the setting of the control lines 9 thereto. The delay line 7 provides a delay of from zero to the total delay of the line with intermediate values of delay being available. The intermediate amounts of delay as well as the delays already discussed are determined by the setting of the control lines 9, these control lines providing a binary input to the delay line. Accordingly, with three control lines 9 as shown, there are eight delay possibilities available. Therefore, assuming that the delay line 7 has a total delay time of 35 nanoseconds, the delay therefrom can be adjusted to be from zero to 35 nanoseconds with all five nanosecond increments therebetween being programmable. The control lines 9 can be externally controlled or can be internally computer controlled, in either case to change the delay on-line.

The output of delay line 7 provides clock pulses on a delayed basis as noted above to the clock input of counter 11, to the write w and chip select cs inputs of the memory 13, which can be a standard random access memory (RAM) chip, such as a 4K RAM, and to the clock input of an analog-to-digital A/D converter 15. The A/D converter 15 in the present embodiment will have a maximum operating rate of 25 MHz in order to demonstrate the applicability of the circuit herein to high sampling rate resolution using a lower sampling rate A/D converter. The counter 11 is enabled by the trigger pulse from the Q output of flip flop 5 and, upon receipt of the trigger pulse, commences counting with each clock pulse thereto to provide output address pulses to the memory 13. These address pulses will locate the storage positions for storage of digital data received from the output of the A/D converter 15. The A/D converter 15 receives analog input information and converts it to digital information under control of the clock pulses received from the output of the delay line 7.

The trigger signal from the Q output of flip flop 5 is also sent to an external device to initiate an event which has a repeatable analog signal associated with the trigger. The analog signal is routed to the input of the A/D converter 15 which converts the analog signal to a digital signal and transmits the digital signal to the memory 13 at the appropriate address therein.

Figure 2A:
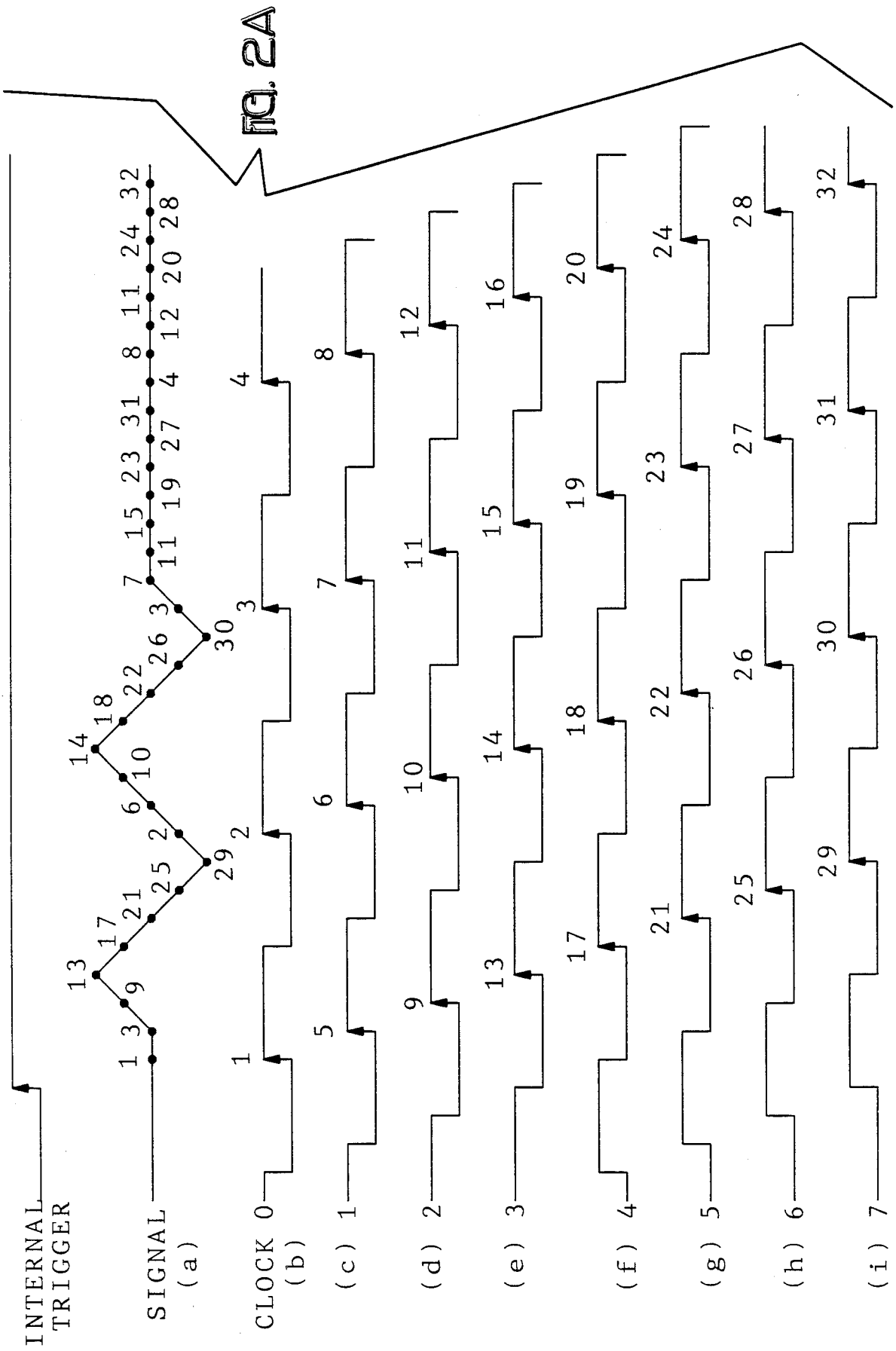
FIGS. 2A and 2B are timing diagrams for use in conjunction with FIG. 1.
Figure 2B:
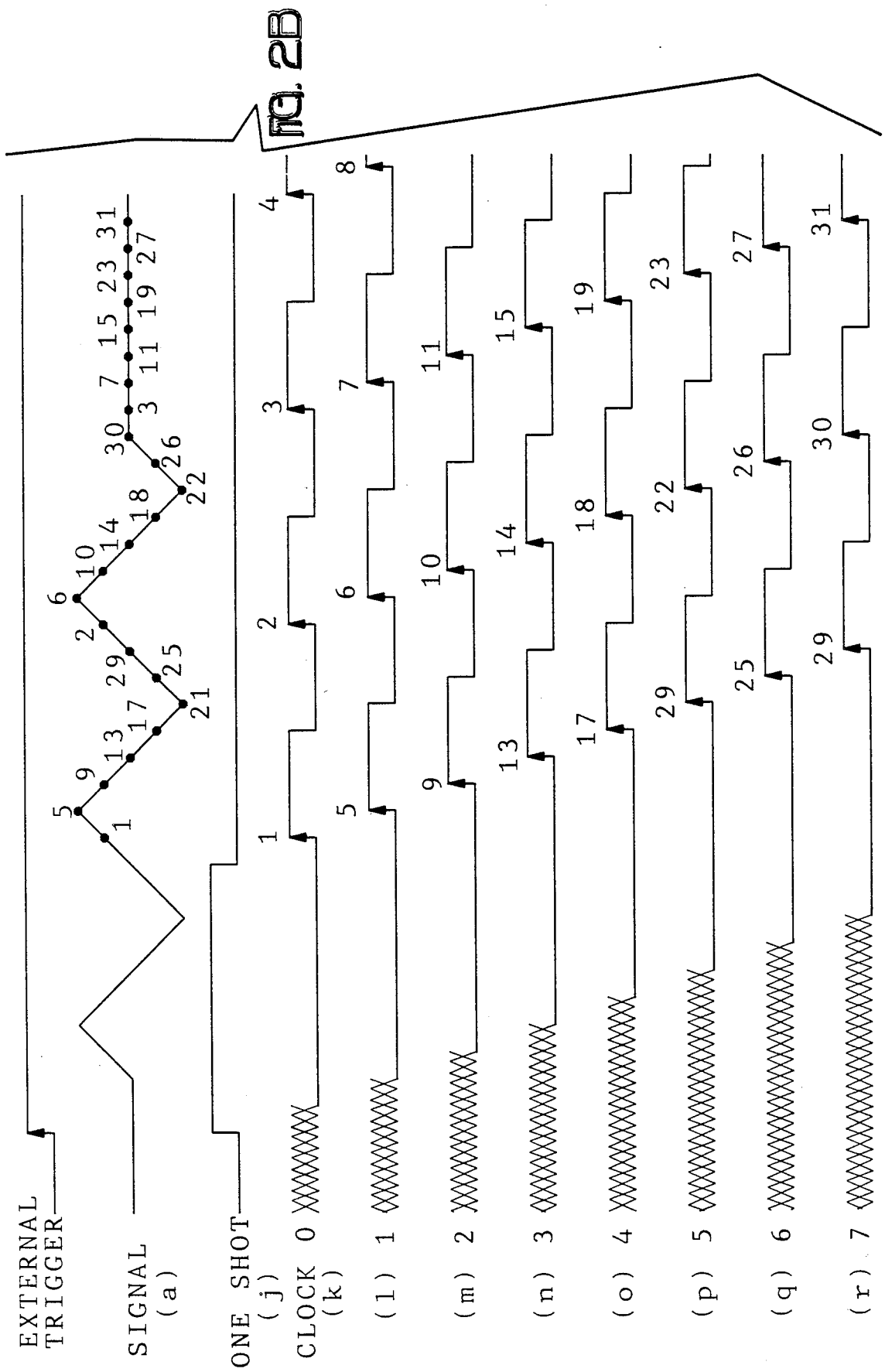

In operation, a trigger input will be presented to the D input of flip flop 5 and cause the one shot 1 to provide a gate pulse to the clock 3 after some short predetermined time delay as determined by the circuitry of the one shot. The delay is the amount of time that the gated clock must be turned off to insure proper synchronization. The clock 3 will then proceed to provide a series of square wave pulses to the E input of the flip flop 5 to provide a square wave output trigger signal from the Q output thereof. These pulses from the clock are also applied to the input of programmable delay line 7 which, it will be assumed, is initially set to provide a zero delay at the output thereof. The result is shown in FIG. 2 wherein, the signal being provided by the external event and applied to the input of the A/D converter 15 is as shown in FIG. 2a, is reapeatable and is 40 nanoseconds from point 1 to point 2. For zero delay, sampling will take place at points 1, 2, 3 and 4 on the curve of FIG. 2a. These points correspond to points 1, 2, 3 and 4 of FIG. 2b which shows the output of delay line 7 for zero delay. This means that the curve of FIG. 2a will be fed to A/D converter 15 and sampled therein at points 1, 2, 3 and 4 with the digital value of the analog signal presented thereto stored in memory 13.

For the next sampling, for example, the control lines 9 are set to a binary "1" to provide a 5 nanosecond delay as shown in delay line 7 to provide a clock signal output therefrom as shown in FIG. 2c. When the trigger signal is applied at the input to the circuit, everything will operate as described above except that sampling of the signal received at the A/D converter will take place 5 nanoseconds later in the signal or at points 5, 6, 7 and 8 in the curve of FIG. 2a. This procedure continues with the delay constantly be changed by 5 nanosecond increments as shown in FIGS. 2d to 2i. When all of the samples have been stored in the memory 13, a readout thereof can be provided by interleaving and combining the eight digitized waveforms in standard manner at points shown in FIG. 2a to provide a reading of all points 1 to 32. In this manner, an inexpensive, low resolution A/D converter can be used to provide the results normally obtainable only with high resolution converters.

Though the invention has been described with respect to a specific preferred embodiment thereof, many variations and modifications will immediately become apparent to those skilled in the art. It is therefore the intention that the appended claims be interpreted as broadly as possible in view of the prior to include all such variations and modifications.

What is claimed is:

1. A converter system for sampling a repetitive series of pulses which comprises, in combination:
   (a) clock means for producing a series of equally spaced clock signals;
   (b) trigger means responsive to a predetermined start signal and a said clock signal for providing a trigger signal;
   (c) controllable repeatable variable delay means including means to control the amount of delay in a regular pattern for delaying said clock signals for a predetermined delay period as determined by said means to control the amount of delay; and
   (d) an analog to digital converter having predetermined maximum sampling rate, controlled by said delayed clock signals, for receiving input signals initiated by said trigger signal.

2. A converter system as set forth in claim 1, further including memory means for storing converted data received from said converter.

3. A converter system for sampling a repetitive series of pulses which comprises, in combination:
   (a) clock means for producing a series of equally spaced clock signals;
   (b) trigger means responsive to a predetermined start signal and a said clock signal for providing a trigger signal;
   (c) controllable variable delay means including means to control the amount of delay for delaying said clock signals for a predetermined delay period as determined by said means to control the amount of delay;
   (d) an analog to digital converter having predetermined maximum sampling rate, controlled by said delayed clock signals, for receiving input signals initiated by said trigger signal,
   (e) memory means for storing converted data received from said converter; and
   (f) control means responsive to said delayed clock signals and enabled by said trigger signal for controlling said memory means.

4. A converter system for sampling a repetitive series of pulses which comprises, in combination:
   (a) clock means for producing a series of equally spaced clock signals;
   (b) trigger means responsive to a predetermined start signal and a said clock signal for providing a trigger signal;
   (c) controllable variable delay means including means to control the amount of delay for delaying said clock signals for a predetermined delay period as determined by said means to control the amount of delay; and
   (d) an analog to digital converter having predetermined maximum sampling rate, controlled by said delayed clock signals, for receiving input signals initiated by said trigger signal; wherein said trigger means is a flip flop.

5. A converter system as set forth in claim 2 wherein said trigger means is a flip flop.

6. A converter system as set forth in claim 3 wherein said trigger means is a flip flop.

7. A converter system for sampling a repetitive series of pulses which comprises, in combination:
   (a) clock means for producing a series of equally spaced clock signals;
   (b) trigger means responsive to a predetermined start signal and a said clock signal for providing a trigger signal;
   (c) controllable variable delay means including means to control the amount of delay for delaying said clock signals for a predetermined delay period as determined by said means to control the amount of delay;
   (d) an analog to digital converter having predetermined maximum sampling rate, controlled by said delayed clock signals, for receiving input signals initiated by said trigger signal; and
   (e) external event and repeatable signal input means connected to said converter.

8. A converter system as set forth in claim 2, further including external event and repeatable signal input means connected to said converter.

9. A converter system as set forth in claim 3, further including external event and repeatable signal input means connected to said converter.

10. A converter system as set forth in claim 4, further including external event and repeatable signal input means connected to said converter.

11. A converter system as set forth in claim 5, further including external event and repeatable signal input means connected to said converter.

12. A converter system as set forth in claim 6, further including external event and repeatable signal input means connected to said converter.

13. A converter system for sampling a repetitive series of pulses which comprises, in combination:
 (a) clock means for producing a series of equally spaced clock signals;
 (b) trigger means responsive to a predetermined start signal and a said clock signal for providing a trigger signal;
 (c) controllable variable delay means including means to control the amount of delay for delaying said clock signals for a predetermined delay period as determined by said means to control the amount of delay;
 (d) an analog to digital converter having predetermined maximum sampling rate, controlled by said delayed clock signals, for receiving input signals initiated by said trigger signal;
 (e) wherein said clock means is a gated clock which is gated by a delayed said start signal of predetermined delay.

14. A converter system as set forth in claim 2 wherein said clock means is a gated clock which is gated by a delayed said start signal of predetermined delay.

15. A converter system as set forth in claim 3 wherein said clock means is a gated clock which is gated by a delayed said start signal of predetermined delay.

16. A converter system as set forth in claim 6 wherein said clock means is a gated clock which is gated be a delayed said start signal of predetermined delay.

17. A converter system as set forth in claim 7 wherein said clock means is a gate clock which is gated by a delayed said start signal of predetermined delay.

18. A converter system as set forth in claim 8 wherein said clock means is a gated clock which is gated by a delayed said start signal of predetermined delay.

19. A converter system as set forth in claim 9 wherein said clock means is a gated clock which is gated by a delayed said start signal of predetermined delay.

20. A converter system as set forth in claim 12 wherein said clock means is a gated clock which is gated by a delayed said start signal of predetermined delay.

21. A method of sampling a repetitive series of pulses which comprises the steps of:
 (a) providing a series of equally spaced clock signals;
 (b) providing a trigger signal responsive to a predetermined start signal and a said clock signal;
 (c) providing a first series of substantially identically and controllably delayed ones of said clock signals;
 (d) providing a second series of substantially identically and controllably delayed ones of said clock signals;
 (e) providing an analog to digital converter having a predetermined maximum sampling rate and controlling said converter with said delayed clock signals; and
 (f) providing input signal to said converter intitiated by said trigger signal.

* * * * *